United States Patent [19]
Shahid

[11] Patent Number: 5,468,338
[45] Date of Patent: Nov. 21, 1995

[54] METHODS FOR SELECTIVELY WET ETCHING SUBSTRATES

[75] Inventor: Muhammed A. Shahid, Ewing Township, Mercer County, N.J.

[73] Assignee: AT&T IPM Corp., Coral Gables, Fla.

[21] Appl. No.: 279,146

[22] Filed: Jul. 22, 1994

[51] Int. Cl.$^6$ ............................................. B05D 5/00
[52] U.S. Cl. ...................... 216/90; 216/79; 156/637.1
[58] Field of Search .................................. 156/654, 625, 156/637, 345, 662; 134/35

[56] References Cited

U.S. PATENT DOCUMENTS

| | | | |
|---|---|---|---|
| 3,964,957 | 6/1976 | Walsh | 156/345 |
| 4,595,454 | 6/1986 | Dautremont-Smith et al. | 156/662 X |
| 4,818,058 | 4/1989 | Bonanni | 350/96.2 |

OTHER PUBLICATIONS

Crystal Patent Research Inc., Search Report, Mar. 4, 1994, 1 page.

*Primary Examiner*—Thi Dang
*Attorney, Agent, or Firm*—Roderick B. Anderson

[57] ABSTRACT

The invention is an improvement of a method for selectively etching a first surface of each of a plurality of wafers (21–23) comprising the steps of masking the entirety of each wafer except certain exposed portions to be etched on the first surface, and immersing the wafers in a heated etch bath (34) for a sufficient time to etch V-grooves (11) into the first surfaces. In one embodiment, the wafers are arranged in the etch bath with the first surface of each wafer (the surface to be etched) facing the first surface of another wafer. The first surfaces of all of the wafers are substantially parallel and are all substantially transverse to a bottom surface of the vessel containing the etch bath. The bottom surface of the vessel is heated to make in the etch bath a temperature gradient that is at a maximum at the bottom surface of the vessel and a minimum at the top surface of the bath. This temperature gradient thermally induces, between each pair of wafer first surfaces, etch bath currents that are directed vertically upwardly. These upwardly directed currents have been found to eliminate, or at least greatly reduce, the incidence of bumps in the V-grooves. The invention works because fresh etchant is continuously flowed past the exposed portions of the wafer to be selectively etched.

18 Claims, 2 Drawing Sheets

METHODS FOR SELECTIVELY WET ETCHING SUBSTRATES

TECHNICAL FIELD

This invention relates to methods for selectively wet etching substrates and, more particularly, to methods for etching V-grooves in monocrystalline wafers, the grooves being subsequently used to support optical fibers.

BACKGROUND OF THE INVENTION

The U.S. patent of Bonanni, U.S. Pat. No. 4,818,058, granted Apr. 4, 1989, incorporated by reference herein, is an example of the literature describing the use of monocrystalline silicon support elements for supporting an optical fiber with a sufficient degree of precision that it can be spliced with another fiber, i.e., abutted to the other fiber with sufficient precision to allow optical energy to flow unimpeded through the abutment. Such support members are made by photolithographically masking and etching matching V-grooves in two support elements. Such grooves can be made with great precision in properly oriented monocrystalline materials such as silicon because mask openings can be made photolithographically and the sidewalls of the grooves are defined by crystallographic planes. Thus, with each optical fiber contained between opposite V-grooves of matching support elements, the location of the optical fiber is precisely controlled. Typically, several parallel optical fibers are held side-by-side between two fiber support elements which constitute a connector. This array of fibers can in turn be spliced to a similar array by abutting them against the other array held by another connector.

The use of V-grooves in monocrystalline substrates to support optical fibers presupposes a uniform etch rate along the length of the substrate. Silicon etching has been used for many years in the integrated circuit art, and so it is well known that the V-grooves can be etched by appropriate masking of a wafer and immersing in a heated etchant such as ethylene diamine pyrocatechol (EDP). Economy of scale requires that numerous semiconductor wafers be etched at one time, with the wafers thereafter being cut to form individual support elements. It has been found, unfortunately, that V-grooves formed in the conventional manner are not always uniformly etched along their entire lengths. That is, some of the V-grooves may contain "bumps," regions at which the silicon has not been etched away to a sufficient depth. These bumps may prevent an optical fiber from seating firmly within the V-groove as is required for its alignment in accordance with the principles of the Bonanni patent.

SUMMARY OF THE INVENTION

The invention is an improvement of a method for selectively etching a first surface of each of a plurality of wafers comprising the steps of masking the entirety of each wafer except certain exposed portions to be etched on the first surface, and immersing the wafers in a heated etch bath for a sufficient time to etch V-grooves into the first surfaces. In one embodiment of the invention, the wafers are arranged in the etch bath with the first surface of each wafer (the surface to be etched) facing the first surface of another wafer. The first surfaces of all of the wafers are substantially parallel and are all substantially transverse to a bottom surface of the vessel containing the etch bath. The bottom surface of the vessel is heated to make in the etch bath a temperature gradient that is at a maximum at the bottom surface of the vessel and a minimum at the top surface of the bath. This temperature gradient thermally induces, between each pair of first surfaces, etch bath currents that are directed vertically upwardly. These upwardly directed currents have been found to eliminate, or at least greatly reduce, the incidence of bumps in the V-grooves. The invention works because fresh etchant is continuously flowed past the exposed portions of the wafer to be selectively etched.

The first surfaces being etched are preferably separated by a distance of less than two millimeters. With the EDP etchant, this spacing is appropriate to insure a rapid flow by capillary action due to the temperature gradient. The heating also preferably produces a second temperature gradient in the bath defined, in any horizontal plane therethrough, by a maximum temperature at the middle of the bath tapering to a minimum at the side surfaces of the vessel, which helps to induce continuous convection currents through the etch bath.

These and other features and benefits of the invention will be better understood from a consideration of the following detailed description taken in conjunction with the accompanying drawing.

DETAILED DESCRIPTION

Figure 1:
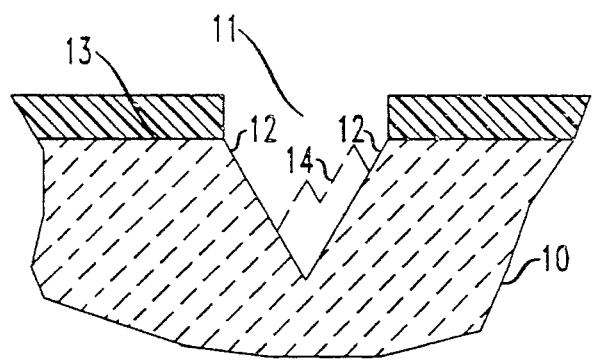
FIG. 1 schematically illustrates a V-groove etched in a monocrystalline substrate.

The drawings are schematic with the dimensions in some cases being distorted to aid in clarity of exposition. FIG. 1 illustrates a monocrystalline wafer 10 in which an elongated V-groove 11 has been formed by wet etching. As pointed out in the Bonanni patent, if the upper surface of the wafer 10 is located on a (100) crystallographic plane, a wet etchant in which the wafer is immersed will etch the wafer anisotropically to form the groove 11 with side surfaces 12 lying on (111) crystallographic planes. The dimensions of the V-groove 11 are determined by an opening in a mask 13 which has been photolithographically defined with precision. If the wafer 10, for example, is of silicon, and the etchant is EDP, the mask 13 may be of silicon dioxide of an appropriate thickness. The V-groove 11 may, for example, be one hundred forty microns wide at the upper surface and ninety-eight microns deep, which are appropriate for supporting an optical fiber.

The etching illustrated in FIG. 1 is normally made simultaneously in an etch bath on a plurality of wafers. After the etch, the mask 13 is removed and the wafer is thereafter diced, or cut, into a plurality of individual optical fiber support elements. Each support element typically comprises a plurality of elongated V-grooves for supporting an array of optical fibers in a parallel side-by-side configuration. Mass production of support elements in this manner has unfortunately been hampered by the tendency of some of the V-grooves to be etched nonuniformly. For example, in FIG. 1, rather than being solely defined by side walls 12, a V-groove 11 may, along part of its length, include a bump 14, shown in phantom, at which there has been incomplete etching of the monocrystalline silicon. Such bumps typically have pyramidal shapes as shown due to the anisotropic nature of the etching. One can appreciate that a groove containing an imperfection such as bump 14 may not be capable of aligning and supporting an optical fiber with the precision needed for masking an optical splice as described in the Bonanni patent.

Figure 2:
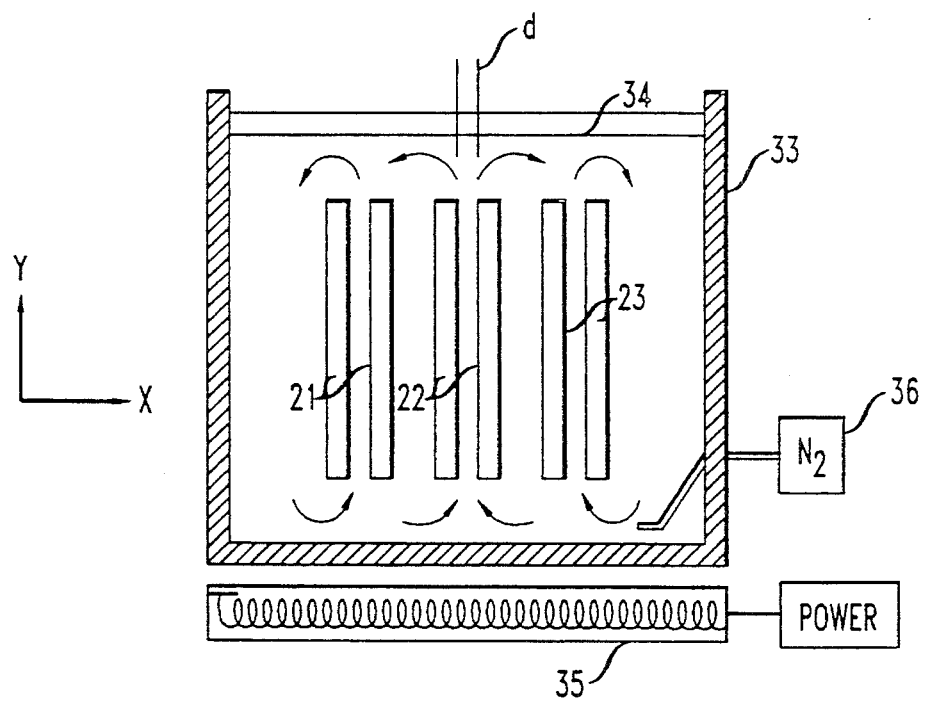
FIG. 2 is a schematic view of an etch bath that may be used to make V-grooves such as shown in FIG. 1.

In accordance with the invention, this problem is overcome by etching the monocrystalline wafers in the manner to be described. Referring to FIG. 2, wafers to be etched are arranged in pairs 21, 22 and 23. The wafers of each pair are masked in their entirety except for a first surface which contains openings for allowing selective etching. The first surfaces of each pair face each other and are separated by a distance d that is smaller than the distance separating the other wafer surfaces. This is illustrated, for example, in FIG. 3 wherein one pair of wafers 22 comprises individual wafers 26 and 27. The wafers are masked in their entirety by masks 28 and 29 except for first surfaces of the wafers that face each other. The first surfaces contain openings 31 for allowing etching of the V-grooves as described before. Openings 31 are elongated and vertically extending, designed to produce vertically extending V-grooves.

Referring again to FIG. 2, the wafer pairs 21–23 are located within a vessel 33 such that they are spaced from the bottom and side surfaces of the vessel. The wafers may be supported by wafer holding apparatus which is commercially available and which, for simplicity, has not been shown; wafer holders are available, for example, from Fluorware, Chaska, Minn., U.S.A. The wafers are immersed in an etchant bath 34 which is heated by a heater 35 to increase reactivity. Nitrogen gas from a source 36 is pumped into the etchant bath to act as an anti-oxidant, as is known in the art. The liquid etchant is illustratively EDP, although other liquid etchants may be used.

Figure 4:
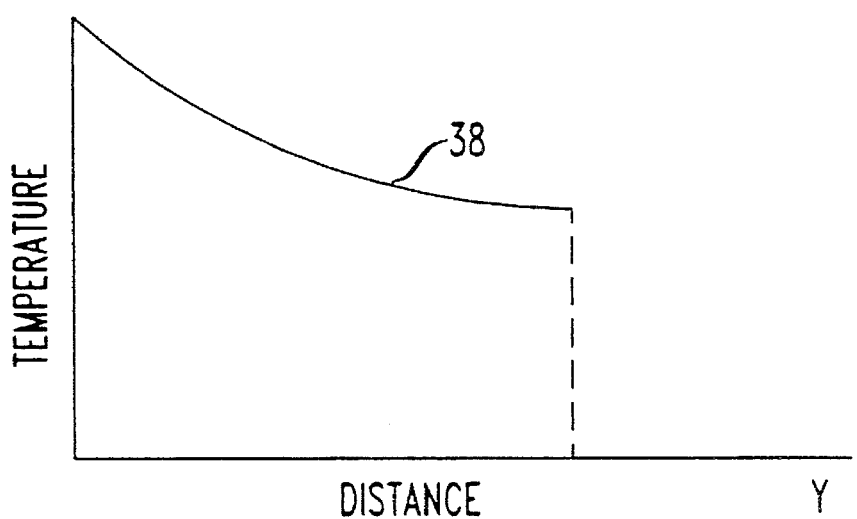
FIG. 4 is a graph of temperature versus distance in the vertical direction in the apparatus of FIG. 2.
Figure 5:
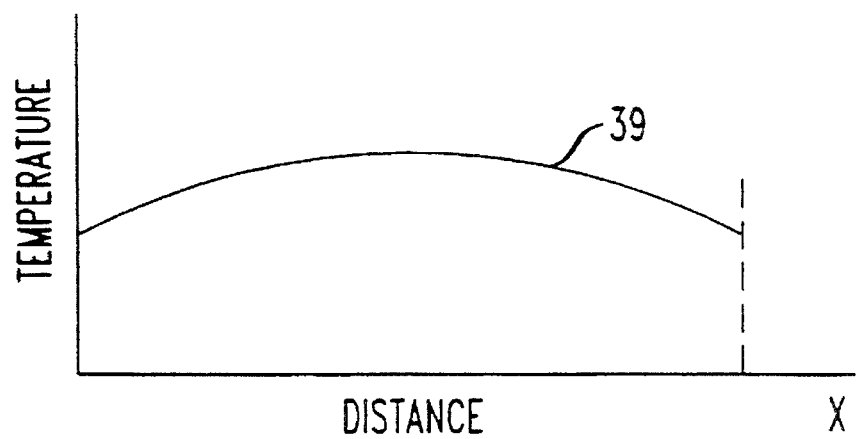
FIG. 5 is a graph of temperature versus distance in the horizontal direction in the apparatus of FIG. 2.

The heater 35 heats the bottom surface of the vessel such that, within the bath, temperature gradients are produced as shown in FIGS. 4 and 5. In FIG. 4, the Y direction is the vertical direction in FIG. 2. Thus, curve 38 illustrates that the temperature is at a maximum at the bottom of the bath, bounded by the bottom surface of the vessel, and a minimum at the upper surface of the bath. Referring to FIG. 5, the temperature varies in the X or horizontal direction as shown by curve 39 such that the temperature along any horizontal plane in the bath is at a maximum at the middle of the bath and tapers to a minimum at the side walls of the vessel 33. These temperature gradients are quite convenient to make by using a symmetrical electric heater such as a conventional hot plate which inherently produces a higher temperature at the center thereof. By locating the heater adjacent the bottom surface of the vessel as shown, one insures a temperature gradient as shown in FIG. 4.

Figure 3:
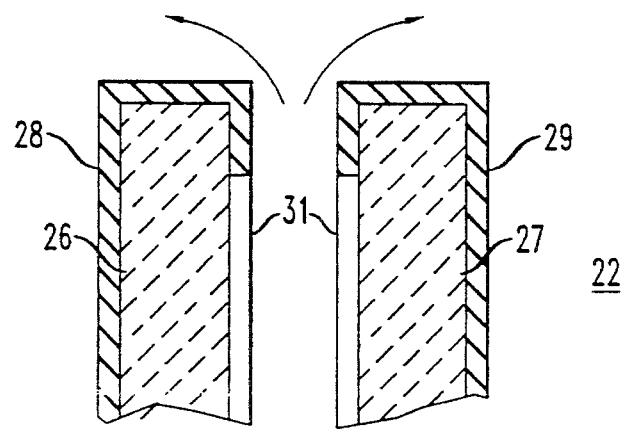
FIG. 3 is a schematic view showing in detail a pair of the monocrystalline wafers of FIG. 2.

The facing first surfaces of each of the pairs 21, 22 and 23 are preferably separated by a distance d smaller than two millimeters. This permits etchant fluid, which tends to rise due to the temperature gradient, to be drawn by capillary action into the space between the facing wafers of each pair, as shown by the arrows. As these currents emerge from the top, they tend to flow along the side walls of the vessel 33 downwardly. Thus, as a consequence of both the small spacing d between the pairs of wafers and the temperature gradients, one produces convection currents that flow vertically upwardly between the pairs of wafers, generally horizontally at the top of the bath, vertically downwardly along the sides of the vessel, and then back up between wafers of each pair. The arrows showing the direction of flow of he bath are also illustrated in FIG. 3.

Use of the invention as described greatly improves the yield of useable fiber support elements by eliminating or greatly reducing the number of bumps 14 shown in FIG. 1. It is believed that the reason for this improved yield is the vigorous current flow along the surfaces being etched which provides a steady replenishment of fresh etchant and a flushing away of etchant that may have become saturated or contaminated. The flow is generally unidirectional and planar, and the velocity is greatly enhanced by using a spacing which is close enough to provide a capillary action to the flow of the currents. The openings 31 of FIG. 3 are preferably parallel to the currents to reduce turbulence. One of the advantages of the invention is its simplicity in that, as can be appreciated from FIG. 2, no apparatus is required for producing the currents that enhance uniform etching.

The heater 35 may generate an elevated temperature in the range of ninety to one hundred ten degrees Centigrade. The wafers 21–23 may be generally circular in shape with a diameter of two to six inches. The wafers may be spaced one to two inches from the upper surface of the etchant bath, one half to one inch from the bottom surface of the vessel and at least one and one-half inch from the side surfaces of the vessel to provide for the establishment of the convection currents shown.

As is known, monocrystalline substances other than silicon can be used in which to form the V-grooves. With silicon, etchants other than EDP, such as KOH, can alternatively be used. Etchants having densities or surface tensions different from EDP may require different spacings between opposing wafer surfaces for optimum capillary action flow. Various other embodiments and modifications may be made by those skilled in the art without departing from the spirit and scope of the invention.

I claim:

1. A method for selectively etching a first surface of each of a plurality of wafers comprising the steps of: masking the entirety of each wafer except certain exposed portions of each first surface to be selectively etched; immersing the wafers in a heated etch bath for a sufficient time to etch a distance into each exposed portion; the bath being contained by a vessel having bottom and side surfaces; removing the wafers; the invention being characterized in that:

the wafers are arranged in the etch bath, with the first surface of each wafer facing a surface of another wafer;

the first surfaces of all the wafers are substantially parallel and are all substantially transverse to a bottom surface of the vessel;

the bottom surface of the vessel is externally heated to make in the etch bath a temperature gradient that is at a maximum at the bottom surface of the vessel and a minimum at a top surface of the bath;

said temperature gradient being sufficient to thermally induce along each wafer first surface etch bath currents that are directed vertically upwardly;

the first surface of each wafer being sufficiently close to a surface of another wafer surface to accelerate the vertical upward flow of etch bath currents by capillary action.

2. The method of claim 1 wherein:

the wafers are made of monocrystalline semiconductor material;

and the selective etch step comprises the step of etching grooves in the first surfaces.

3. The method of claim 2 wherein:

the step of etching grooves comprises the step of etching vertically extending V-grooves of sufficient depth and uniformity as to support optical fibers.

4. The method of claim 2 wherein:

said first surface of each wafer is separated from another wafer surface by a distance of less than two millimeters.

5. The method of claim 4 wherein:

the heating step comprises the step of making a second temperature gradient in the etch bath defined, in any horizontal plane therethrough, by a maximum temperature at the middle of the bath tapering to a minimum temperature at the side surfaces of the vessel.

6. The method of claim 5 wherein:

the wafers are spaced sufficiently from the top surface of the bath, the side surfaces of the vessel and the bottom surface of the vessel so as to allow, in the etchant bath, convection currents that flow vertically upwardly between the first surfaces, generally horizontally between the wafers and the upper surface of the bath, vertically downwardly between the wafers and the side surfaces of the vessel, and generally horizontally between the bottom of the vessel and the wafers.

7. The method of claim 6 wherein:

the step of etching grooves comprises the step of etching V-grooves of sufficient depth and uniformity as to support optical fibers.

8. The method of claim 7 wherein:

vertically extending mask openings cause the etching of vertically extending V-grooves.

9. The method of claim 1 wherein:

the bottom surface is externally heated by a heater adjacent to only the bottom surface of the vessel and external to the vessel.

10. A method for processing semiconductor wafers having first and second major surfaces comprising the steps of:

making masks on first surfaces of a plurality of pairs of semiconductor wafers, each mask having openings to allow selective etching of V-grooves in the corresponding first surface, each V-groove being of a sufficient depth to support an optical fiber;

locating the wafers in a vessel such that the first surfaces of each pair face each other and are spaced from bottom and side surfaces of the vessel;

the wafers in the vessel being immersed in an etchant bath such that an upper surface of the bath is spaced from the wafers;

heating the etchant bath and producing in the etchant bath currents that flow between the first surfaces in a direction parallel to the first surfaces;

the heating and producing step comprising the step of making a first temperature gradient in the etchant, the temperature gradient extending in a direction parallel to the first surfaces and being sufficient to induce thermally said currents;

the first surfaces of each pair are more closely spaced than are second surfaces of wafers, the spacing of the first surfaces being sufficiently close to accelerate current flow by capillary action.

11. The method of claim 10 wherein:

said first surfaces are spaced by a distance of less than two millimeters, whereby said etchant is caused to flow from a region of high temperature to a region of lower temperature by capillary action.

12. The method of claim 10 wherein:

the heating and producing step comprises the step of making a second thermal gradient in the etchant bath transverse to the first surfaces, the temperature of the gradient varying directly with distance from the sides of the vessel.

13. The method of claim 10 wherein:

the first thermal gradient is produced by a heater adjacent the bottom surface of the vessel;

and the first surfaces of the wafers are arranged to be substantially perpendicular to the bottom surface of the vessel and substantially parallel to side surfaces of the vessel.

14. The method of claim 12 wherein:

the first surfaces of each pair are separated by a distance of less than two millimeters.

15. The method of claim 14 wherein:

the first thermal gradient is produced by a heater adjacent the bottom surface of the vessel;

and the first surfaces are arranged to be substantially perpendicular to the bottom surface of the vessel and substantially parallel to side surfaces of the vessel.

16. The method of claim 15 wherein:

the heating and producing step produces thermal convection currents in the etchant bath that flow vertically upwardly between each pair of first surfaces, and vertically downwardly in a region adjacent the side surfaces of the vessel.

17. The method of claim 15 wherein:

the wafers are two to six inches in diameter, the wafers are spaced one to two inches from the upper surface of the etchant bath, one half to one inch from the lower surface of the vessel and at least one and one-half inches from the side surfaces of the vessel.

18. The method of claim 16 wherein:

the mask openings extend in a vertical direction.

* * * * *